United States Patent
Shin et al.

(10) Patent No.: US 11,172,574 B2
(45) Date of Patent: Nov. 9, 2021

(54) PRINTED CIRCUIT BOARD ASSEMBLY

(71) Applicant: Samsung Electro-Mechanics Co., Ltd., Suwon-si (KR)

(72) Inventors: Jae-Ho Shin, Suwon-si (KR); Jun-Oh Hwang, Suwon-si (KR); Yun-Je Ji, Suwon-si (KR); Tae-Seong Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/676,629

(22) Filed: Nov. 7, 2019

(65) Prior Publication Data

US 2020/0305282 A1 Sep. 24, 2020

(30) Foreign Application Priority Data

Mar. 22, 2019 (KR) .................. 10-2019-0032913
Jun. 5, 2019 (KR) .................. 10-2019-0066933

(51) Int. Cl.
*H05K 1/14* (2006.01)
*H05K 3/46* (2006.01)
*H05K 1/02* (2006.01)
*H05K 3/36* (2006.01)

(52) U.S. Cl.
CPC .......... *H05K 1/148* (2013.01); *H05K 1/0277* (2013.01); *H05K 1/144* (2013.01); *H05K 1/145* (2013.01); *H05K 3/361* (2013.01); *H05K 3/4691* (2013.01); *H05K 2201/09145* (2013.01)

(58) Field of Classification Search
CPC ...... H05K 1/148; H05K 1/145; H05K 3/4691; H05K 1/0277; H05K 1/144; H05K 3/361; H05K 2201/09145; H05K 2201/2027; H05K 2201/09181; H05K 2201/042; H05K 1/147; H05K 2201/2036
USPC .......................................... 174/254; 361/749
See application file for complete search history.

(56) References Cited

U.S. PATENT DOCUMENTS

| | | | | |
|---|---|---|---|---|
| 3,971,127 A * | 7/1976 | Giguere | ................. | H05K 1/189 29/827 |
| 5,754,409 A * | 5/1998 | Smith | ................. | H01R 12/7005 361/803 |
| 7,656,673 B1 * | 2/2010 | Fries | ................. | H05K 1/189 361/749 |
| 2002/0006503 A1 * | 1/2002 | Watanabe | ......... | H01L 23/49827 428/209 |

(Continued)

FOREIGN PATENT DOCUMENTS

JP 2007-103554 A 4/2007
KR 10-2017-0014504 A 2/2017

*Primary Examiner* — Steven T Sawyer
(74) *Attorney, Agent, or Firm* — NSIP Law

(57) ABSTRACT

A printed circuit board assembly includes a first printed circuit board, a second printed circuit board, and a space holding member. The second printed circuit board includes a first rigid substrate region, spaced apart from and opposed to the first printed circuit board, and a flexible substrate region, extended from one side of the first rigid substrate region to be connected to the first printed circuit board. The space holding member includes a first member, disposed between the first printed circuit board and the second printed circuit board to maintain a space therebetween, and a second member configured to fix the first printed circuit board or the second printed circuit board on the first member.

19 Claims, 3 Drawing Sheets

(56) References Cited

U.S. PATENT DOCUMENTS

| | | | | |
|---|---|---|---|---|
| 2006/0114347 A1* | 6/2006 | Kricorissian | ........ | H04N 5/2256 |
| | | | | 348/340 |
| 2009/0038836 A1* | 2/2009 | Takahashi | ............ | H05K 3/4691 |
| | | | | 174/261 |
| 2011/0199748 A1* | 8/2011 | Kagawa | .............. | H05K 7/20436 |
| | | | | 361/796 |
| 2015/0173192 A1* | 6/2015 | Kohn | .................... | H05K 3/3447 |
| | | | | 361/804 |
| 2015/0173193 A1* | 6/2015 | Vanderveen | ......... | H01R 12/737 |
| | | | | 361/749 |
| 2015/0261265 A1* | 9/2015 | Dean | ....................... | H05K 1/147 |
| | | | | 361/679.31 |
| 2015/0357733 A1* | 12/2015 | Sanford | ................. | H01R 12/62 |
| | | | | 361/749 |
| 2016/0174378 A1* | 6/2016 | Johnson | ................. | H05K 1/148 |
| | | | | 361/760 |
| 2019/0148852 A1* | 5/2019 | Wang | ................. | H01R 12/7023 |
| | | | | 439/65 |

\* cited by examiner

PRINTED CIRCUIT BOARD ASSEMBLY

CROSS-REFERENCE TO RELATED APPLICATIONS

This application claims the benefit under 35 USC 119(a) of Korean Patent Application Nos. 10-2019-0032913 filed on Mar. 22, 2019 and 10-2019-0066933 filed on Jun. 5, 2019 in the Korean Intellectual Property Office, the entire disclosures of which are incorporated herein by reference for all purposes.

BACKGROUND

1. Field

The following description relates to a printed circuit board assembly.

2. Description of Related Art

Over time, mobile devices tend to be thinner or smaller, while battery capacity tends to steadily increase in usage time. In order to maximize space utilization in devices, it may be possible to adopt a multi-layered structure in which very thin circuit boards and electronic components are laminated.

However, a conventional interposer substrate connecting substrates of the multi-layer structure has severe structural restrictions, particularly design restrictions such as a signal connection method.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board assembly includes a first printed circuit board, a second printed circuit board, and a space holding member. The second printed circuit board includes a first rigid substrate region, spaced apart from and opposed to the first printed circuit board, and a flexible substrate region, extended from one side of the first rigid substrate region to be connected to the first printed circuit board. The space holding member includes a first member, disposed between the first printed circuit board and the second printed circuit board to maintain a space therebetween, and a second member configured to fix the first printed circuit board or the second printed circuit board on the first member.

The space holding member may include a double fastening structure. The first member may have a fastening structure configured to fix one of the first printed circuit board and the second printed circuit board to a support. The second member may have a fastening structure configured to fix the other of the first printed circuit board and the second printed circuit board to the first member.

The first member may include a first head part disposed between the first printed circuit board and the second printed circuit board. The first head part may press and fix one of the first printed circuit board and the second printed circuit board.

The second member may be coupled to the first head part through the other of the first printed circuit board and the second printed circuit board. The second member may include a second head part configured to press and fix the other of the first printed circuit board and the second printed circuit board.

A recessed first groove may be formed at one side edge of the first rigid substrate region, and the flexible substrate region may extend from an inner wall of the first groove.

A recessed second groove may be formed at one side edge of the first printed circuit board, and the bent flexible substrate region may be disposed to pass within the second groove.

The second printed circuit board may further include a second rigid substrate region coupled to the first printed circuit board. The flexible substrate region may connect the first rigid substrate region and the second rigid substrate region.

A first connection part may be disposed on the first printed circuit board, and a second connection part may be disposed on the second rigid substrate region of the second printed circuit board to be coupled with the first connection part.

In another general aspect, a printed circuit board assembly includes a first printed circuit board comprising a connector, a second printed circuit, a space holding member, and a fastener. The second printed circuit board includes a flexible substrate region extending from one side to be connected with the connector. The space holding member is disposed between the first printed circuit board and the second printed circuit board to maintain a space therebetween. The fastener is configured to fix the first printed circuit board, the second printed circuit board, and the space holding member to each other.

The fastener may include a first member disposed between the first printed circuit board to maintain the space therebetween and a second member configured to fix the first printed circuit board or the second printed circuit board on the first member.

The space holding member may include a double fastening structure. The first member may have a fastening structure configured to fix one of the first printed circuit board and the second printed circuit board to a support. The second member may have a fastening structure configured to fix the other of the first printed circuit board and the second printed circuit board to the first member.

The first member may include a first head part disposed between the first printed circuit board and the second printed circuit board, and the first head part may press and fix one of the first printed circuit board and the second printed circuit board.

The second member may be coupled to the first head part through the other of the first printed circuit board and the second printed circuit board, and the second member may include a second head part configured to press and fix the other of the first printed circuit board and the second printed circuit board.

A recessed first groove may be formed at one side edge of the first rigid substrate region, and the flexible substrate region may extend from an inner wall of the first groove.

A second groove may be formed at one side edge of the first printed circuit board, and the flexible substrate region may be disposed to pass within the second groove.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
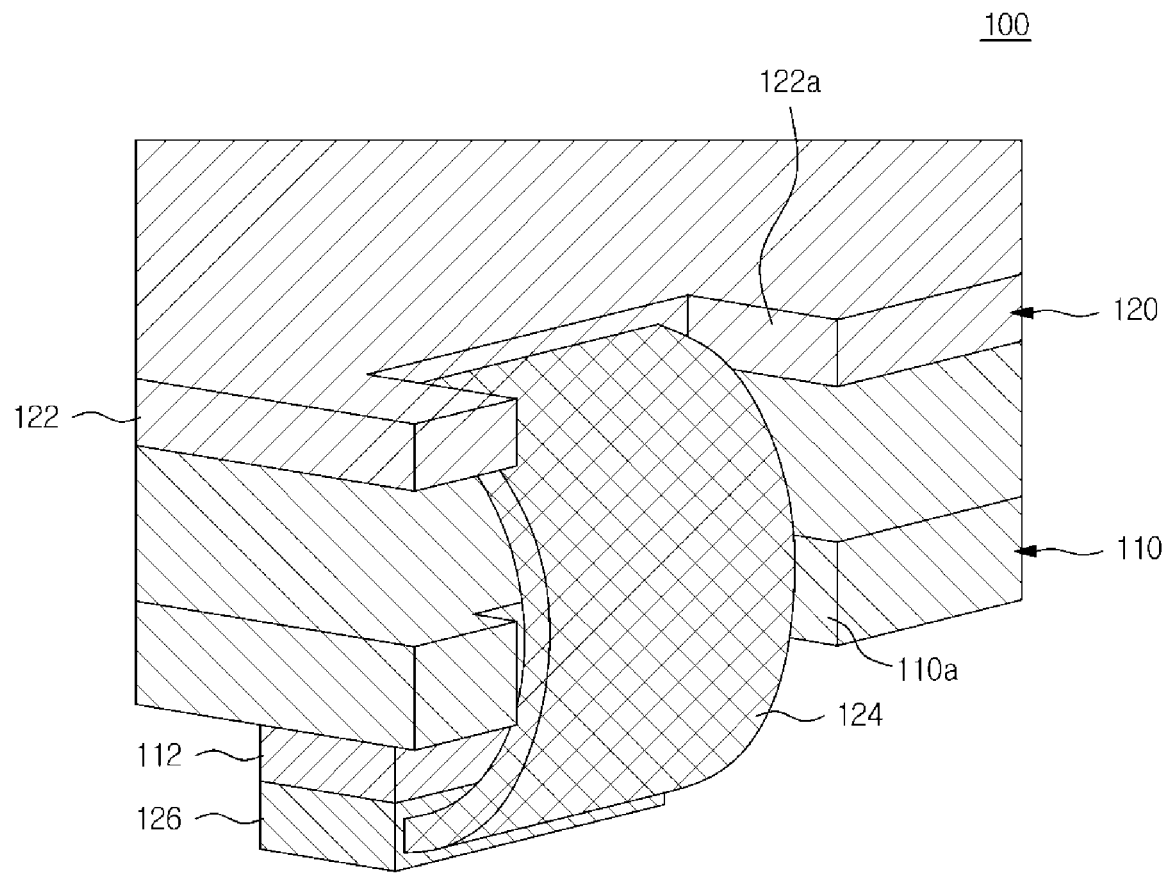
FIG. 1 and FIG. 2 are diagrams illustrating an example of a printed circuit board assembly according to an embodiment of this application.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degree or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
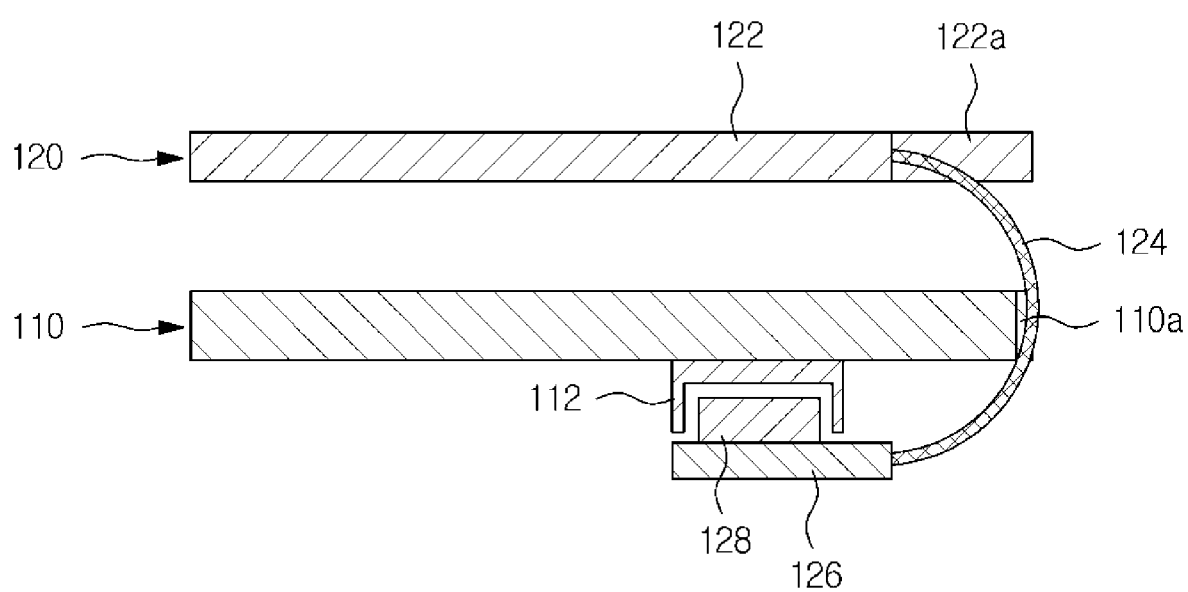

FIG. 1 and FIG. 2 are diagrams illustrating an example of a printed circuit board assembly according to an embodiment of this application.

Referring to FIG. 1 and FIG. 2, a printed circuit board assembly 100 according to an embodiment of this application may include a first printed circuit board 110 and a second printed circuit board 120, in which the first printed circuit board 110 and the second printed circuit board 120 may be electrically connected to each other through a flexible substrate region 124 of the second printed circuit board 120.

Figure 3:
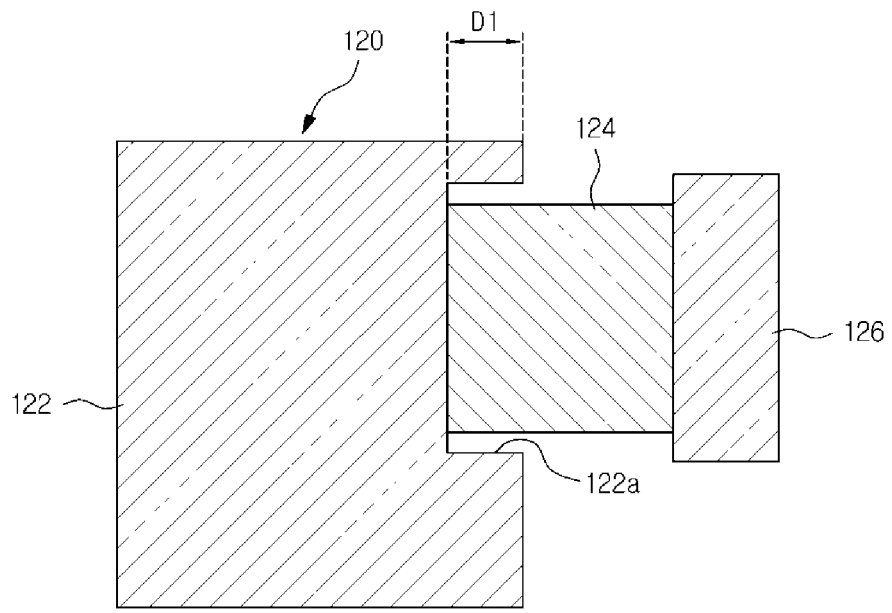
FIG. 3 is a diagram illustrating an example of a second printed circuit board of a printed circuit board assembly according to an embodiment of this application.

FIG. 3 is a diagram illustrating an example of a second printed circuit board of a printed circuit board assembly according to an embodiment of this application.

Referring to FIG. 3, the second printed circuit board 120 may include rigid substrate regions 122 and 126 and a flexible substrate region 124 to provide a rigid-flex PCB structure.

For example, a flexible copper clad laminate (FCCL) composed of a flexible insulating layer, such as a polyimide film and a copper foil, is laminated to form a flexible substrate capable of bending. A circuit pattern and a rigid insulating layer such as an epoxy, which is a relatively harder insulating layer than a flexible insulating layer, are selectively additionally formed on the flexible substrate to form a rigid substrate made of a harder material than the flexible substrate. Thus, a printed circuit board having a rigid-flex structure is formed in which only the region where the flexible substrate remains becomes a flexible substrate region capable of bending and the other region does a rigid substrate region.

Here, the rigidity and the flexibility of a substrate may mean a difference in degree of bending relative to each other. A board that can conform to a desired shape, or to flex during its use is a flexible board, and a board that cannot conform to a desired shape, or to flex during its use is a rigid board.

Referring to FIG. 3, a rigid substrate region may be divided into two regions of a first rigid substrate region 122 and a second rigid substrate region 126. The flexible substrate region 124 may connect between the first rigid substrate region 122 and the second rigid substrate region 126.

Referring to FIG. 1 and FIG. 2, the first printed circuit board 110 and the first rigid substrate region 122 of the second printed circuit board 120 may be laminated in a multi-layered structure facing each other. For example, the first printed circuit board 110 may be disposed below and the second printed circuit board 120 may be disposed thereon so that an upper surface of the first printed circuit board 110 and a lower surface of the second printed circuit board 120 may face each other. The first printed circuit board 110 may be a rigid substrate. The first printed circuit board 110 and the first rigid substrate region 122 of the second printed circuit board 120, which are facing each other, may be connected through the flexible substrate region 124 of the second printed circuit board 120. It is thus possible to form an electrical path vertically between the substrates in the multilayer structure by using the flexibility of the flexible substrate region. Here, the flexible substrate region 124 may be extended from one side of the first rigid substrate region 122.

For example, a first connection part 112 may be formed on the first printed circuit board 110 and a second connection part 128 to be coupled to the first connection part 112 may be formed on the second rigid substrate region 126 of the second printed circuit board 120. Since the flexible substrate region 124 connects the first rigid substrate region 122 and the second rigid substrate region 126, when the second rigid substrate region 126 of the second printed circuit board 120 is connected to the first printed circuit board 110, the first rigid substrate region 122 of the second printed circuit board 120 may be connected to the first printed circuit board 110 through the flexible substrate region 124. Here, the flexible substrate region 124 may be bent as needed so that the second rigid substrate region 126 is disposed adjacent to the first connection part 112. The first connection part 112 and the second connection part 128 may be a pair of male and female connectors to be coupled to each other.

As described above, an interposer substrate for connecting the first printed circuit board 110 and the second printed circuit board 120 stacked in a multi-layer structure is not required. That is, the flexible substrate region 124 of the second printed circuit board 120 may replace the functionality of the conventional interposer substrate.

In an example, when the second printed circuit board 120 does not include the second rigid substrate region 126, the second connection part may be formed on the flexible substrate region 124. In this case, the second connection part formed on the flexible substrate region 124 of the second printed circuit board 120 may be connected to the first printed circuit board 110.

The first connection part 112 may be formed on a surface of the first printed circuit board 110, which is the other surface opposing the second printed circuit board 120. The flexible substrate region 124 of the first printed circuit board 120 may be bent by wrapping an edge of the first printed circuit board 110.

Referring to FIG. 1 and FIG. 2, the flexible substrate region 124 of the second printed circuit board 120 may be bent in a C shape and the corner of the first printed circuit board 110 may be disposed inside the bent flexible substrate region 124.

Referring to FIG. 3, a first groove 122a, which is recessed inward, may be formed at one side edge of the first rigid substrate region 122 in the second printed circuit board 120. For example, the first groove 122a may have a "U" shape or a "[" shape. Here, the flexible substrate region 124 may have a shape extending from the inner wall of the first groove 122a. Accordingly, the flexible substrate region 124 may be connected to the first rigid substrate region 122 on the inner side of the outer boundary line of the first rigid substrate region 122.

Referring to FIG. 1 to FIG. 3, when the flexible substrate region 124 of the second printed circuit board 120 is bent by wrapping the corner of the first printed circuit board 110, a depth D1 of the first groove 122a may be similar to or greater than a width of the bent portion of the flexible substrate region 124. Accordingly, the bent flexible substrate region 124 may minimally protrude from the outer boundary line of the first rigid substrate region 122. Therefore, it may be possible to prevent the bent portion of the flexible substrate region 124 from excessively protruding into an occupied space.

Figure 4:
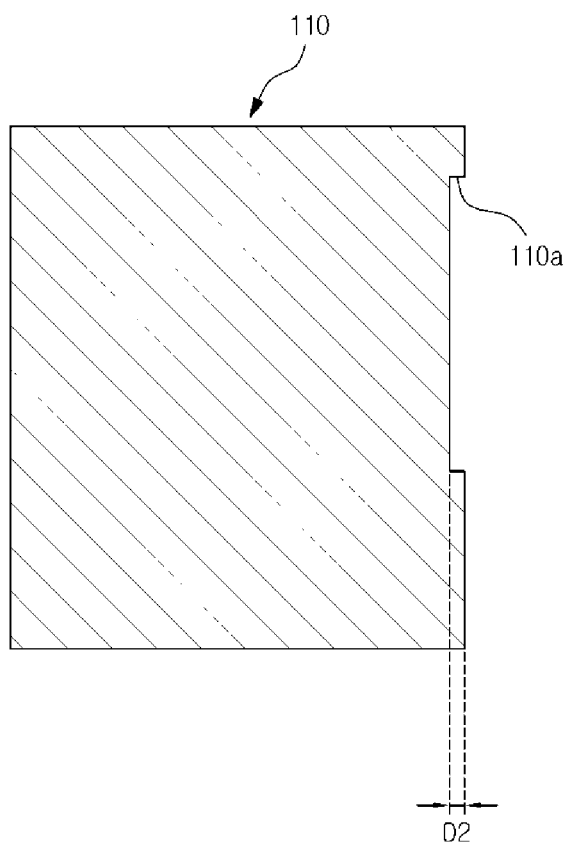
FIG. 4 is a diagram illustrating an example of a first printed circuit board of a printed circuit board assembly according to an embodiment of this application.

FIG. 4 is a diagram illustrating an example of a first printed circuit board of a printed circuit board assembly according to an embodiment of this application.

Referring to FIG. 4, a recessed second groove 110a may be formed at one side edge of the first printed circuit board 110.

Referring to FIG. 1 and FIG. 2, the flexible substrate region 124 may be bent into the second groove 110a. Accordingly, the bent flexible substrate region 124 may minimally protrude from the outer boundary line of the first printed circuit board 110. Therefore, it may be possible to prevent the bent portion of the flexible substrate region 124 from excessively protruding into an occupied space.

The second groove 110a may be formed correspondingly below the first groove 122a, so that the flexible substrate region 124 may bend downwardly in the first groove 122a to pass through the second groove 110a.

The flexible substrate region 124 passing through the second groove 110a may be further bent towards the first connection part 112 of the first printed circuit board 110. A depth D2 of the second groove 110a may be smaller than the depth D1 of the first groove 122a because the width of the bent portion of the flexible substrate region 124 passing through the second groove 110a may be relatively small.

Figure 5:
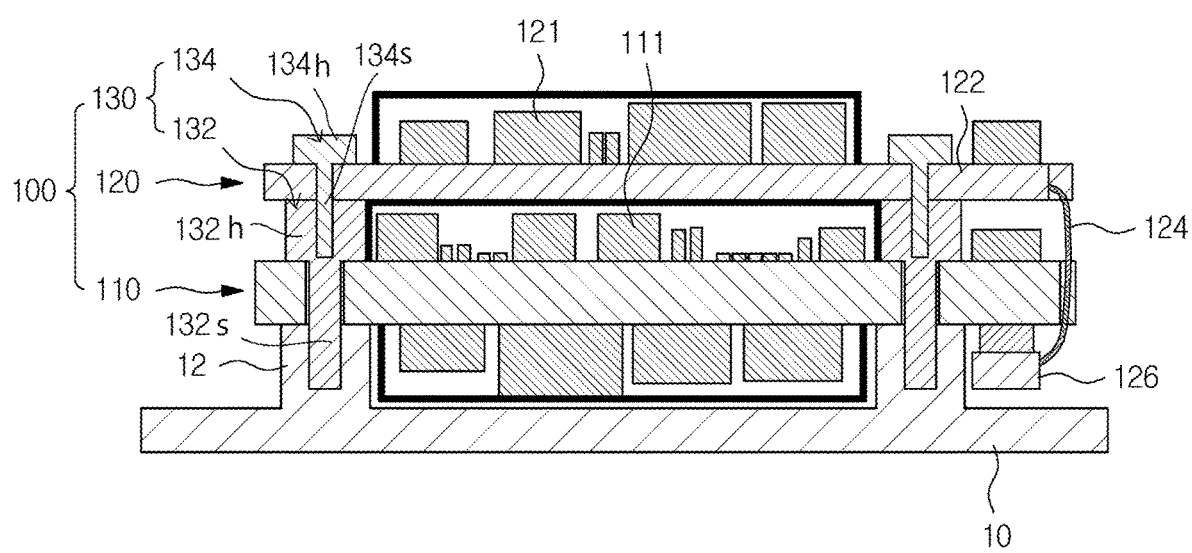
FIG. 5 is a diagram illustrating an installation of an example of a printed circuit board assembly according to an embodiment of this application.

FIG. 5 is a diagram illustrating an installation of an example of a printed circuit board assembly according to an embodiment of this application.

The printed circuit board assembly 100 in which the first printed circuit board 110 and the second printed circuit board 120 are stacked in a multilayer structure may further include a space holding member 130 interposed between the first printed circuit board 110 and the second printed circuit board 120 to maintain a space therebetween. For example, the space holding member 130 may include a first member 132 interposed between the first printed circuit board 110 and the second printed circuit board 120 to maintain a space therebetween, and a second member 134 configured to fix the first printed circuit board or the second printed circuit board on the first member.

Referring to FIG. 5, the space holding member 130 may be provided on an upper surface of the first printed circuit board 110 to support a lower surface of the second printed circuit board 120.

The printed circuit board assembly 100 of this embodiment may include the space holding member 130 having a double bolt structure. The space holding member 130 may be provided with a first member 132 having a bolt structure to fix the first printed circuit board 110 to a support such as a case 10 and a second member 134 having a bolt structure to fix the second printed circuit board 120 to the first member 132. The first member 132 may maintain the second printed circuit board 120 at a predetermined interval from the first printed circuit board 110.

For example, the case 10 may include a support 12 that supports the first printed circuit board 110.

When the first printed circuit board 110 is placed on the support 12, the first member 132 is coupled to the support 12 through the first printed circuit board 110 and the first printed circuit board 110 is fixed by a first head part 132h of the first member 132.

The first head part 132h may be disposed between the first printed circuit board 110 and the second printed circuit board 120. When a first screw part 132s of the first member 132 is inserted and driven into the support 12, the first head part 132h having a larger diameter than the first screw part 132s may be driven to fix the first printed circuit board 110.

The rigid substrate region of the second printed circuit board 120 may be placed on the first head part 132h of the first member 132 and the second member 134 may be passed through the second printed circuit board 120 to be coupled to the first head part 132h of the first member 132. The second screw part 134s of the second member 134 may be inserted and driven into the first head part 132h. Here, the second head part 134h of the second member 134 having a larger diameter than the second screw part 134s may be driven to fix the second printed circuit board 120.

Thus, the rigid substrate region of the second printed circuit board 120 may be fixed by the second head part 134h of the second member 134. Here, the first head part 132h of the first member 132 may be formed with a female screw to which the second member 134 may be screwed. The space between the first printed circuit board 110 and the second printed circuit board 120 may be maintained by the thickness of the first head part 132h of the first member 132.

This embodiment describes that the first printed circuit board 110 is fixed to the support by the first member 132 and the second printed circuit board 120 is fixed by a second member 134 thereon; however, it is not limited thereto. For example, in another embodiment, the second printed circuit board 120 may be secured to the support by the first member 132 and the first printed circuit board 110 may be secured thereon by the second member 134.

Electronic elements 111 and 121 may be mounted on the first printed circuit board 110 or the second printed circuit board 120 within the space kept by the space holding member 130 between the first printed circuit board 110 and the second printed circuit board 120.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board assembly, comprising:
    a first printed circuit board, including a first recessed groove formed on a first side edge of the first printed circuit board; and
    a second printed circuit board, including a second recessed groove formed on a first side edge of the second printed circuit board, and comprising a first rigid substrate region, a second rigid substrate region, and a flexible substrate region that extends from one side edge of the first rigid substrate region to be connected to the second rigid substrate region,
    wherein the first rigid substrate region is configured to be spaced apart from the first printed circuit board,
    wherein the second rigid substrate region is configured to be connected to an outer surface of the first printed circuit board when oppositely disposed,
    wherein the flexible substrate region is disposed in the second recessed groove, and is further disposed to extend completely through the first recessed groove, and
    wherein a depth of the first recessed groove is different from a depth of the second recessed groove.

2. The printed circuit board assembly of claim 1, further comprising a space holding member comprising a first member, disposed between the first printed circuit board and the second printed circuit board to maintain a space therebetween, and a second member configured to fix the first printed circuit board or the second printed circuit board on the first member.

3. The printed circuit board of claim 1, wherein the depth of the first recessed groove is less than the depth of the second recessed groove.

4. The printed circuit board assembly of claim 2, wherein the space holding member comprises a double fastening structure,
    the first member has a fastening structure configured to fix one of the first printed circuit board and the second printed circuit board to a support, and
    the second member has a fastening structure configured to fix the other of the first printed circuit board and the second printed circuit board to the first member.

5. The printed circuit board assembly of claim 2, wherein the second recessed groove is formed at the one side edge of the first rigid substrate region, and
    the flexible substrate region extends from an inner wall of the second recessed groove.

6. The printed circuit board assembly of claim 2, wherein a first connection part is disposed on the first printed circuit board.

7. The printed circuit board assembly of claim 4, wherein the first member includes a first head part disposed between the first printed circuit board and the second printed circuit board, and
    the first head part presses and fixes one of the first printed circuit board and the second printed circuit board.

8. The printed circuit board assembly of claim 5, wherein the first recessed groove is formed at one side edge of the first printed circuit board, and
    the bent flexible substrate region is disposed to pass within the first recessed groove.

9. The printed circuit board assembly of claim 6, wherein a second connection part is disposed on the second rigid substrate region to be coupled with the first connection part.

10. The printed circuit board assembly of claim 7, wherein the second member is coupled to the first head part through the other of the first printed circuit board and the second printed circuit board, and the second member includes a second head part configured to press and fix the other of the first printed circuit board and the second printed circuit board.

11. A printed circuit board assembly, comprising:
a first printed circuit board, including a first groove formed on a first side edge of the first printed circuit board, and comprising a connector disposed on an outer surface of the first printed circuit board; and
a second printed circuit board, including a second groove formed on a first edge of the second printed circuit board, and comprising a flexible substrate region extending from one side edge to be connected with the connector,
wherein the second printed circuit board is configured to be spaced apart faced from the first printed circuit board when oppositely disposed,
wherein the flexible substrate region is disposed in the second groove, and is further disposed to extend completely through the first groove, and
wherein a depth of the first groove is different from a depth of the second groove.

12. The printed circuit board assembly of claim 11, further comprising a space holding member, disposed between the first printed circuit board and the second printed circuit board to maintain a space therebetween, comprising a fastener configured to fix the first printed circuit board, the second printed circuit board, and the space holding member to each other.

13. The printed circuit board assembly of claim 11, wherein the depth of the first groove is less than the depth of the second groove.

14. The printed circuit board assembly of claim 12, wherein the fastener comprises a first member disposed between the first printed circuit board to maintain the space therebetween and a second member configured to fix the first printed circuit board or the second printed circuit board on the first member.

15. The printed circuit board assembly of claim 12, wherein the second groove is formed at the one side edge of a first rigid substrate region of the second printed circuit board, and the flexible substrate region extends from an inner wall of the second groove.

16. The printed circuit board assembly of claim 14, wherein the space holding member comprises a double fastening structure,
the first member has a fastening structure configured to fix one of the first printed circuit board and the second printed circuit board to a support, and
the second member has a fastening structure configured to fix the other of the first printed circuit board and the second printed circuit board to the first member.

17. The printed circuit board assembly of claim 15, wherein the first groove is formed at the one side edge of the first printed circuit board, and the flexible substrate region is disposed to pass within the first groove.

18. The printed circuit board assembly of claim 16, wherein the first member includes a first head part disposed between the first printed circuit board and the second printed circuit board, and
the first head part presses and fixes one of the first printed circuit board and the second printed circuit board.

19. The printed circuit board assembly of claim 18, wherein the second member is coupled to the first head part through the other of the first printed circuit board and the second printed circuit board, and
the second member includes a second head part configured to press and fix the other of the first printed circuit board and the second printed circuit board.

* * * * *